(12) United States Patent
Page

(10) Patent No.: US 6,366,136 B1
(45) Date of Patent: Apr. 2, 2002

(54) VOLTAGE COMPARATOR CIRCUIT WITH HYSTERESIS

(75) Inventor: Ronald William Page, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/599,380

(22) Filed: Jun. 22, 2000

Related U.S. Application Data

(60) Provisional application No. 60/153,013, filed on Sep. 9, 1999.

(51) Int. Cl.[7] .......................... G01R 15/00; G11C 7/00; H03F 3/45
(52) U.S. Cl. ........................ 327/53; 327/205; 327/206; 327/72; 327/80
(58) Field of Search ................................. 327/205, 206, 327/50–53, 60, 62, 72, 73, 77, 80, 81, 88, 89, 78; 323/315, 316

(56) References Cited

U.S. PATENT DOCUMENTS

| | | | | |
|---|---|---|---|---|
| 4,775,807 A | * | 10/1988 | Bukowski, Jr. | 327/72 |
| 4,922,132 A | * | 5/1990 | Horvitz et al. | 327/73 |
| 5,122,680 A | * | 6/1992 | Stakely et al. | 327/206 |
| 5,929,679 A | * | 7/1999 | Ohwada | 327/206 |
| 5,936,435 A | * | 8/1999 | Schwenkel et al. | 327/78 |
| 6,154,066 A | * | 11/2000 | Wen et al. | 327/205 |

* cited by examiner

Primary Examiner—Terry D. Cunningham
Assistant Examiner—Long Nguyen
(74) Attorney, Agent, or Firm—Wildman, Harrold, Allen, & Dixon; Mark A. Dalla Valle

(57) ABSTRACT

A voltage comparator with hysteresis that includes a differential amplifier, voltage divider circuits and a current mirror circuit. The input terminals of the two differential amplifier circuit branches are biased at unequal potentials by the voltage divider circuits. One voltage divider output voltage is fixed and the other is variable. The input terminal of the differential amplifier circuit branch biased at the fixed potential receives an AC-coupled input signal voltage. The sum of the input signal voltage and the fixed bias voltage is compared against the variable bias voltage. A current mirror circuit, which is activated during conduction by the differential amplifier circuit branch biased at the variable potential, shunts a portion of the current used by the voltage divider circuit that generates the variable potential. This causes the variable voltage divider output voltage to change, thereby introducing hysteresis into the voltage comparison performed by the differential amplifier. The output of the current mirror circuit can be implemented to include multiple branches that are selectively connectable, thereby allowing the user to selectively vary the amount of hysteresis in terms of the differences in the input signal voltage necessary to cause the conducting differential amplifier circuit branches to alternate.

13 Claims, 3 Drawing Sheets

| FIG. 4A | FIG. 4B |

VOLTAGE COMPARATOR CIRCUIT WITH HYSTERESIS

RELATED APPLICATIONS

This application claims the benefit of U.S. Provisional Application No. 60/153,013, filed Sept. 9, 1999. This application is also related to: U.S. patent application Ser. No. 09/599,620, filed on even date herewith, and entitled "Voltage Clamping Circuit"; U.S. patent application Ser. No. 09/271,027, filed Mar. 17, 1999, and entitled "Multiplexed Video Interface System"; and to U.S. patent application Ser. No. 09/348,533, filed Jul. 7, 1999, and entitled "Digitally Controlled Signal Magnitude Control Circuit." The disclosure of each of the foregoing applications is incorporated herein by reference.

BACKGROUND OF THE INVENTION

1. Field of the Invention

The present invention relates to signal detection circuits, such as voltage comparators, and in particular, to voltage comparator circuits with hysteresis.

2. Description of the Related Art

As integrated circuits become increasingly complex and the number of functions they perform become more numerous, it has become increasingly important that such integrated circuits be capable of interfacing with signal sources that generate large or otherwise unusual signals. This is particularly true in mixed signal applications where the integrated circuits is often a digital circuit that operates with binary logic and is powered by a low voltage power supply and yet must be capable of dealing with analog signals which can exceed the voltage or current handling capabilities of the integrated circuit.

For example, integrated circuits for controlling video monitors that use cathode ray tubes (CRTs), such as those typically used with personal computers, must be able to work with many types of large signals. One example would be the horizontal and vertical flyback pulses generated during the horizontal and vertical retrace intervals, respectively, of the video display. Referring to FIG. 1, in the case of the vertical flyback pulses, such pulses can be in the range of 50 volts peak-to-peak with bipolar values, i.e., with much of the signal being positive but also some of the signal being negative with respect to the system reference, or ground.

Referring to FIG. 2, one example of such an integrated circuit includes an internal amplifier stage A1 which is responsible for converting such pulses into a digital pulse stream for use elsewhere within the system. An external resister Rext is used to limit the current flowing into and out from the circuit as well as limit the maximum input voltage appearing at the input terminal T to values less than the power supply rails. The external capacitor Cext is used in conjunction with the external resister Rext and the effective internal resistance Rth at terminal T to partially differentiate the vertical flyback signal Vertfb, thereby removing DC and low frequency signal components.

As noted, the input resistance at the input terminal T is established by the resistance Rth, while the DC voltage at the input terminal T is established by a DC voltage source Vth. The voltage comparator VC is designed to have hysteresis (discussed in more detail below) so as to be unaffected by noise contained within the input signal, such as horizontal rate signal noise which is often contained within the vertical flyback pulses. For positive signal excursions of the input signal, the voltage comparator VC triggers at the input terminal threshold voltage Vth, while for negative signal excursions it triggers at a different threshold voltage. Additionally, diodes D1, D2 are used at the input terminal T to provide protection against electrostatic discharge (ESD) events in accordance with well-known techniques.

In this application, the input stage A1 generates a digital signal Vstart which is used to start a counter, or timer. The positive, or rising, edge of this signal Vstart sets a counter/timer which counts horizontal intervals using the horizontal blinking signal Hblank, and is initially transmitted through as the output signal Vblank via an OR logic gate (since the counter/timer may take as long as one horizontal line interval to begin timing the duration of the pulse). The timer resets the final output signal Vblank when it reaches a value which has been preset in accordance with data stored in a vertical counter register Vcount (which has been preset by a microcontroller via an I2C interface). During the active time of the output signal Vblank, an AND logic gates prevents any further transitions of the input signal Vstart from retriggering the counter.

Referring to FIG. 3, it can be seen that it is important that the positive pulse period of the vertical flyback signal be sufficiently long during the initial interval to prevent the output signal Vblank from switching back to a low state from its high state. In other words, this positive pulse interval t1 should be at least as long as one horizontal scan interval. The pulse width t2 of the output signal Vblank will be the product of the horizontal scan interval th and the contents of the Vcount register.

SUMMARY OF THE INVENTION

A voltage comparator with hysteresis in accordance with the present invention introduces hysteresis into the voltage comparison function in response to changes in an input signal voltage relative to a variable reference voltage. The reference voltage has one of two values depending upon the value of the input signal voltage, and is switched between the two values by sensing the current a flowing within one of the circuit branches of the differential amplifier that forms the voltage comparator. The sensed current is mirrored as a shunt current that is drawn away from the voltage divider used to generate the reference voltage.

A voltage comparator circuit with hysteresis in accordance with one embodiment of the present invention includes power terminals, an input signal terminal, first and second voltage divider circuits, an amplifier circuit and a current mirror circuit. The power terminals convey a power supply voltage, while the input signal terminal conveys an input signal. The first voltage divider circuit is coupled between the input signal terminal and the power terminals and provides a first bias voltage at the input signal terminal in response to reception of the power supply voltage. The input signal has opposing peak signal levels of opposite polarities relative to the bias voltage. The second voltage divider circuit is coupled between the power terminals and conducts a voltage divider current and thereby provides a second bias voltage in response to reception of the power supply voltage. The first and second bias voltages are unequal. The amplifier circuit is coupled between the power terminals, the input signal terminal and the second voltage divider circuit, and includes first and second circuit branches that alternately conduct first and second branch currents, respectively. The first amplifier circuit branch conducts the first branch current when a sum of the first bias voltage and the input signal has a first polarity and magnitude relative to the second bias voltage. The second amplifier circuit branch conducts the second branch current when the sum of the first bias voltage and the input signal has a second polarity and magnitude relative to the second bias voltage. The current mirror circuit is coupled between the amplifier circuit, the second voltage divider circuit and one of the power terminals. The current mirror circuit includes an input circuit branch that is coupled to the second amplifier circuit branch and conducts the second branch current upon reception thereof. The current mirror circuit also includes an output circuit branch that is coupled to the second voltage divider circuit and conducts a portion of the voltage divider current in response to conduction of the second branch current by the input circuit branch. This has the effect of causing the second bias voltage to have a first value when the first amplifier circuit branch conducts the first branch current and the second bias voltage to have a second value when the second amplifier circuit branch conducts the second branch current.

A method for performing a voltage comparison with hysteresis in accordance with another embodiment of the present invention includes the steps of:

receiving an input signal via an input signal terminal;

generating a first bias voltage at the input signal terminal, wherein the input signal has opposing peak signal levels of opposite polarities relative to the bias voltage;

conducting a voltage divider current and thereby generating a second bias voltage, wherein the first and second bias voltages are unequal;

alternately conducting first and second circuit branch currents by conducting the first circuit branch current when a sum of the first bias voltage and the input signal has a first polarity and magnitude relative to the second bias voltage, and conducting the second circuit branch current when the sum of the first bias voltage and the input signal has a second polarity and magnitude relative to the second bias voltage; and shunting a portion of the voltage divider current by mirroring the second circuit branch current, thereby causing the second bias voltage to have a first value during conduction of the first circuit branch current, and the second bias voltage to have a second value during conduction of the second circuit branch current.

DETAILED DESCRIPTION OF THE INVENTION

Figure 1:
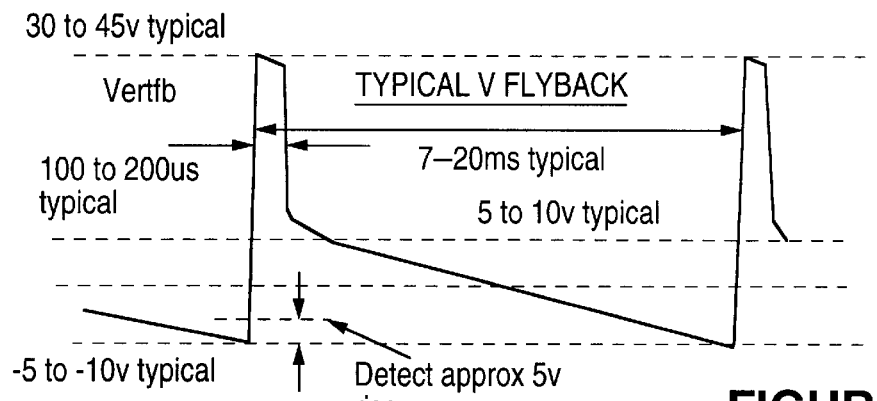
FIG. 1 is a signal diagram depicting typical vertical flyback pulses for a video monitor using a CRT.
Figure 3:
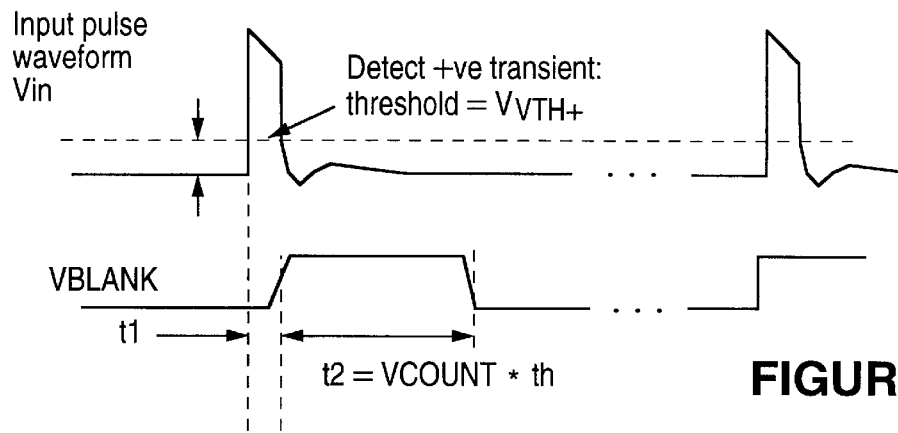
FIG. 3 is a signal diagram depicting the desired relationship between the input and output signals for the system of FIG. 2.
Figure 2:
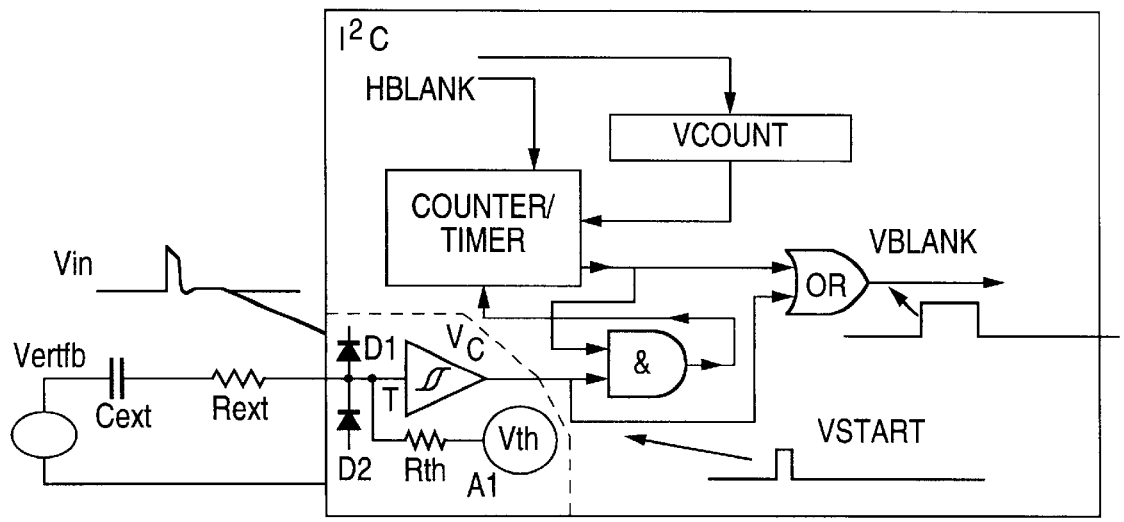
FIG. 2 is a functional block diagram of a mixed signal system in which large bipolar analog signals, such as vertical flyback pulses, are converted to unipolar digital signal pulses.
Figure 4A:
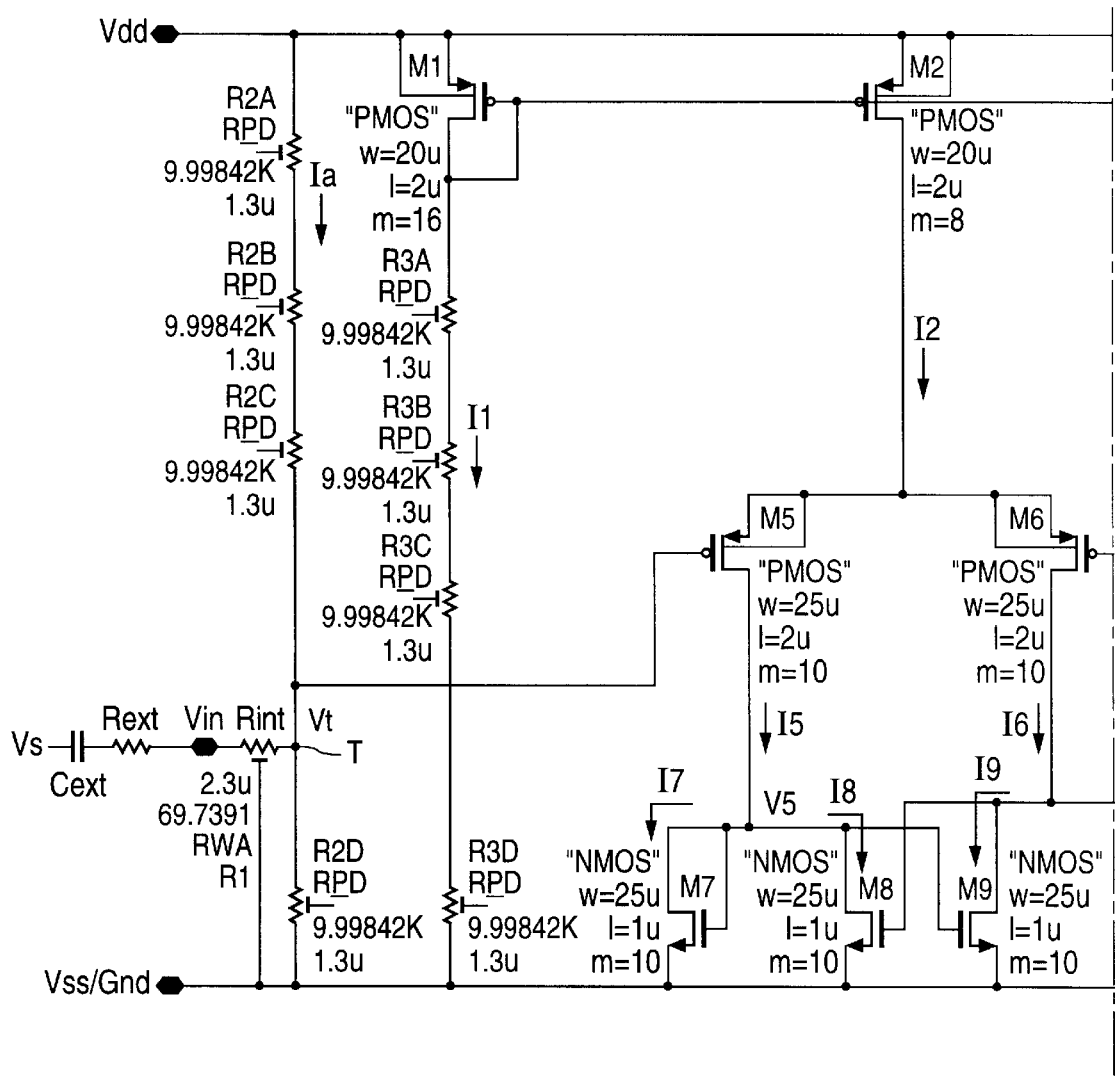
FIG. 4 is a schematic diagram of a voltage comparator circuit with hysteresis in accordance with one embodiment of the present invention.
Figure 4B:
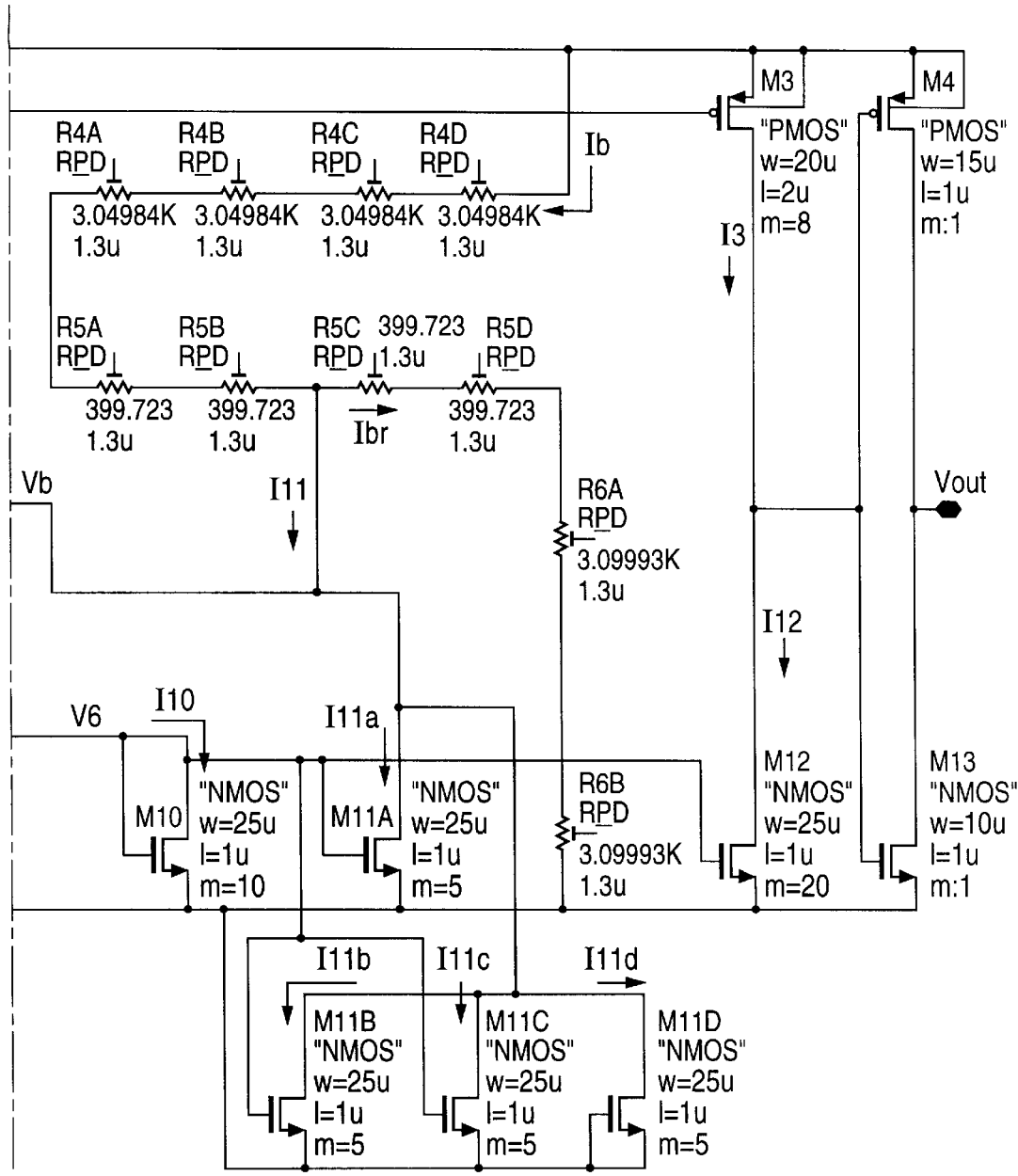

Referring to FIG. 4, a voltage comparator circuit with hysteresis in accordance with one embodiment of the present invention is configured as shown and can be described as follows. Power supply terminals Vdd and Vss/Gnd provide the power supply voltage to the circuit, with terminal Vss/Gnd serving as the reference, or ground, terminal and terminal Vdd serving as the positive power supply voltage terminal (e.g., +5 volts). (It should be recognized, however, that as an alternative, the system can also be based on a negative power supply voltage with terminal Vdd serving as the reference terminal and Vss serving as the negative power supply voltage terminal.) An input signal voltage Vin, which originates as a current limited signal voltage Vs via an external resister Rext, arrives at the node connecting the external resister Rext and a tow value internal resister Rint. This produces a DC-clamped input voltage Vt at terminal T. A serial resister network R2 (R2A, R2B, R2C, R2D) is connected between the 10 power supply terminals Vdd, Vss/Gnd to serve two functions. First, the value of the resisters R2A, R2B, R2C, R2D are selected to establish the resistive component of the input impedance. Second, the ratio of the lower resistive element R2D relative to the sum of all of the resistive elements R2A, R2B, R2C, R2D is selected to establish the DC clamp voltage at terminal T. Accordingly, the input signal is clamped at, or rides on, this DC potential.

The output signal Vout is a digital signal with peak voltage excursions between the potentials of Vdd and Vss/Gnd and has high and low signal states that correspondence to the high and low signal states of the input voltage Vin, respectively. For example, in the case of using such a circuit to detect and identify vertical flyback pulses (as discussed above), the output signal voltage Vout will be at a logic high during the vertical flyback interval, and will be at a logic low during the vertical scanning interval.

As shown, the circuit of FIG. 4 is implemented using metal oxide semiconductor field effect transistors (MOSFETs) of both PMOS and NMOS types. However, it will be recognized that the principles of the invention can be realized with a bipolar junction transistor (BJT) implementation as well, with PNP and NPN transistors used in place of PMOS and NMOS transistors, respectively, in accordance with well-known design techniques.

Transistors M1, M7 and M10 are diode-connected, while the remaining transistors are used as three terminal devices. Accordingly, transistors M1, M2 and M3 operate together as a current mirror circuit, with transistor M1 serving as the input circuit branch and transistors M2 and M3 serving as output circuit branches, thereby providing replicated, or mirrored, currents I2 and I3 which are scaled replicas of the input current I1. Similarly, transistors M7 and M9 and transistors M10, M8, M11 (M11A, M11B, M11C) and M12 operate together as current mirror circuits. In the case of transistors M10, M8, M11 and M12, transistor M10 serves as the input branch of the current mirror circuit while transistors M8, M11 and M12 serve as output branches. In the case of transistor M11, such an output branch may actually consist of multiple devices, thereby causing multiple mirrored currents to be generated. For example, in this particular configuration as shown, three output devices M11A, M11B, M11C are used, thereby causing three corresponding respective output currents I11a, I11b, I11c to be generated. A fourth device, M11D is not used in this configuration; therefore, its gate and source terminals are shorted, thereby disabling transistor M11D. (The reason for an interconnection of these multiple current mirror output devices is discussed in more detail below.)

As noted, in the presently described implementation, transistor M11 is formed of three devices M11A, M11B, M11C, while a fourth available device M11D is not used. It will be readily understood that in an integrated circuit environment such multiple devices M11A, M11B, M11C, M11D can be integrated as part of the overall chip design and selectively connected as part of the operational circuit with the appropriate metal masks. Such an implementation is permanent in the sense that once the integrated circuit has been fabricated, no alterations are possible. However, it will be further readily understood that techniques other than the use of different metal masks may be used to achieve the desired connections. For example, individual transistors M11A, M11B, M11C, M11D can be selectively connected as part of the operational circuit by using fusible links or pass transistors (enabled by control signals) to couple the appropriate gate terminals of the desired transistors to either the drain terminal of transistor M10 or to Vss/Gnd.

Transistors M4 and M13 operate together as an inverter circuit to provide buffering and a logic level inversion of the voltage signal appearing at the drain terminals of transistors M3 and M12 to form the output voltage signal Vout.

As noted above, an input resistive circuit R2 (R2A, R2B, R2C, R2D) establishes the DC potential at the gate terminal of transistor M5 which serves as one of the two circuit branches of the differential amplifier formed by transistors M5 and M6. Similarly, another resistor string R4 (R4A, R4B, R4C, R4D), R5 (R5A, R5B, R5C, R5D), R6 (R6A, R6B) operates a resistive voltage divider to establish the bias voltage Vb at the gate terminal of transistor M6. Accordingly, a voltage divider current Ib is drawn from the power supply terminal Vdd. This current divides at the gate terminal of transistor M6 to provide current I11 for transistor M11 and a remainder current Ibr for the lower portion of the voltage divider circuit. Hence, depending upon the magnitude of the currents I11A, I11B, I11C that form this divided current I11, the resulting bias voltage Vb at the gate terminal of M6 will be higher or lower. In a preferred embodiment, the bias voltage Vb at the gate terminal of transistor M6 is set at a value slightly greater than the value of the DC component of the voltage Vt at the gate terminal of transistor M5.

This circuit has three basic states. The first state is that during which no input signal Vs is applied. In such state, since the DC gate terminal voltage of transistor M5 is less than that of transistor M6, transistor M5 is turned on and transistor M6 is turned off. Accordingly, the tail current I2 is conducted through the circuit branch formed by transistor M5. This branch current I5 forms the input current I7 to the current mirror formed by transistors M7 and M9. This causes transistor M9 to be turned on, thereby pulling the gate terminals of transistors M10, M8, M11 and M12 to circuit ground which ensures that such transistors are turned off.

The second circuit state is that during which the input signal Vs is applied and the resulting differentiated signal Vin is sufficiently high as to cause the voltage Vt at terminal T to rise above the value of the bias voltage Vb at the gate terminal of transistor M6. This causes the state of the differential amplifier to switch such that transistor M6 is now turned on and transistor M5 is now turned off. This causes the tail current I2 to be conducted through the circuit branch formed by transistor M6. This branch current I6 provides the input branch current I10 for the current mirror circuit formed by transistors M10, M8, M11 and M12. In turn, this causes transistor M8 to be turned on, thereby effectively connecting the gate terminals of transistors M7 and M9 to circuit ground, thereby ensuring that such transistors are turned off. Additionally, this causes transistors M11A, M11B and M11C to be turned on, thereby diverting current I11 away from the resistive voltage divider. This reduces the remainder current Ibr in the voltage divider, thereby causing the voltage Vb at the gate terminal of transistor M6 to decrease. This has the effect of reducing the threshold voltage necessary for the input signal voltage Vin to transcend in order to cause the state of the differential amplifier to revert to that in which transistor M6 becomes turned off and transistor M5 becomes turned on. Hence, hysteresis is introduced.

With transistor M10 turned on, transistor M12, which serves as yet another output circuit branch of the current mirror circuit, produces a mirrored current I12 which is greater than the mirrored current I3 provided by transistor M3. This, in turn, causes the voltage at the drain terminals of transistors M3 and M12 to be in a low state, thereby causing the output voltage Vout to be in a high state due to the inversion action of transistors M4 and M13.

The third state is that in which the input signal Vin has now dropped below the reduced threshold voltage produced as a result of the reduced bias voltage Vb generated at the gate terminal of transistor M6 by the voltage divider. In this state, transistor M5 is once again turned on as is its associated current mirror circuit M7, M9, and transistor M6 is turned off as is its associated current mirror circuit M10, M8, M11, M12. This causes mirrored current I3 to now prevail over current I12 (which is now substantially zero), thereby causing the voltage at the drain terminals of transistors M3 and M12 to be in a high state and, in turn, the output voltage Vout to be in a low state.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a voltage comparator circuit with hysteresis, said voltage comparator circuit comprising:

first and second power terminals for conveying a power supply voltage;

an input signal terminal for conveying an input signal;

a first voltage divider circuit, coupled between said input signal terminal and said first and second power terminals, that provides a first bias voltage at said input signal terminal in response to reception of said power supply voltage, wherein said input signal has opposing peak signal levels of opposite polarities relative to said bias voltage;

a second voltage divider circuit, coupled between said first and second power terminals, that conducts a voltage divider current and thereby provides a second bias voltage in response to reception of said power supply voltage, wherein said first and second bias voltages are unequal;

an amplifier circuit, coupled between said first and second power terminals, said input signal terminal and said second voltage divider circuit, which includes first and second circuit branches that alternately conduct first and second branch currents, respectively, wherein said first amplifier circuit branch conducts said first branch current when a sum of said first bias voltage and said input signal has a first polarity and magnitude relative to said second bias voltage, and said second amplifier circuit branch conducts said second branch current when said sum of said first bias voltage and said input signal has a second polarity and magnitude relative to said second bias voltage; and a current mirror circuit, coupled between said amplifier circuit, said second voltage divider circuit and one of said first and second power terminals, which includes an input circuit branch, coupled to said second amplifier circuit branch, that conducts said second branch current upon reception thereof, and an output circuit branch, coupled to said second voltage divider circuit, that conducts a portion of said voltage divider current in response to conduction of said second branch current by said input circuit branch, thereby causing said second bias voltage to have a first value when said first amplifier circuit branch conducts said first branch current, and said second bias voltage to have a second value when said second amplifier circuit branch conducts said second branch current.

2. The apparatus of claim 1, wherein said first voltage divider circuit comprises a passive resistive voltage divider circuit.

3. The apparatus of claim 1, wherein said second voltage divider circuit comprises a passive resistive voltage divider circuit.

4. The apparatus of claim 1, wherein said amplifier circuit comprises:

a current source circuit, coupled between said first and second power terminals, that provides a tail current in response to reception of said power supply voltage; and a differential amplifier circuit, coupled between said current source circuit, said input signal terminal and said second voltage divider circuit, which includes said first and second circuit branches that alternately conduct said tail current as said first and second branch currents, respectively, in response to reception of said input signal and said first and second bias voltages.

5. The apparatus of claim 4, wherein said current source circuit comprises another current mirror circuit which includes:

an input circuit branch, coupled between said first and second power terminals; and an output circuit branch coupled between one of said first and second power terminals and said differential amplifier circuit, that provides said tail current.

6. An apparatus including a voltage comparator circuit with hysteresis, said voltage comparator circuit comprising:

first and second power terminals for conveying a power supply voltage;

an input signal terminal for conveying an input signal;

a first voltage divider circuit, coupled between said input signal terminal and said first and second power terminals, that provides a first bias voltage at said input signal terminal in response to reception of said power supply voltage, wherein said input signal has opposing peak signal levels of opposite polarities relative to said bias voltage;

a second voltage divider circuit, coupled between said first and second power terminals, that conducts a voltage divider current and thereby provides a second bias voltage in response to reception of said power supply voltage, wherein said first and second bias voltages are unequal;

an amplifier circuit, coupled between said first and second power terminals, said input signal terminal and said second voltage divider circuit, which includes first and second circuit branches that alternately conduct first and second branch currents, respectively, wherein said first amplifier circuit branch conducts said first branch current when a sum of said first bias voltage and said input signal has a first polarity and magnitude relative to said second bias voltage, and said second amplifier circuit branch conducts said second branch current when said sum of said first bias voltage and said input signal has a second polarity and magnitude relative to said second bias voltage;

a current mirror circuit, coupled between said amplifier circuit, said second voltage divider circuit and one of said first and second power terminals, which includes an input circuit branch, coupled to said second amplifier circuit branch, that conducts said second branch current upon reception thereof, an output circuit branch, coupled to said second voltage divider circuit, that conducts a portion of said voltage divider current in response to conduction of said second branch current by said input circuit branch, thereby causing said second bias voltage to have a first value when said first amplifier circuit branch conducts said first branch current, and said second bias voltage to have a second value when said second amplifier circuit branch conducts said second branch current, and another output circuit branch coupled to said first amplifier circuit branch; and another current mirror circuit, coupled between said amplifier circuit and said one of said first and second power terminals, which includes an input circuit branch, coupled to said first amplifier circuit branch, that conducts said first branch current upon reception thereof, and an output circuit branch, coupled to said second amplifier circuit branch, that couples said second amplifier circuit branch to said one of said first and second power terminals in response to conduction of said first branch current by said input circuit branch.

7. An apparatus including a voltage comparator circuit with hysteresis, said voltage comparator circuit comprising:

first and second power terminals for conveying a power supply voltage;

an input signal terminal for conveying an input signal;

a first voltage divider circuit, coupled between said input signal terminal and said first and second power terminals, that provides a first bias voltage at said input signal terminal in response to reception of said power supply voltage, wherein said input signal has opposing peak signal levels of opposite polarities relative to said bias voltage;

a second voltage divider circuit, coupled between said first and second power terminals, that conducts a voltage divider current and thereby provides a second bias voltage in response to reception of said power supply voltage, wherein said first and second bias voltages are unequal;

an amplifier circuit, coupled between said first and second power terminals, said input signal terminal and said second voltage divider circuit, which includes first and second circuit branches that alternately conduct first and second branch currents, respectively, wherein said first amplifier circuit branch conducts said first branch current when a sum of said first bias voltage and said input signal has a first polarity and magnitude relative to said second bias voltage, and said second amplifier circuit branch conducts said second branch current when said sum of said first bias voltage and said input signal has a second polarity and magnitude relative to said second bias voltage; and a current mirror circuit, coupled between said amplifier circuit, said second voltage divider circuit and one of said first and second power terminals, which includes an input circuit branch, coupled to said second amplifier circuit branch, that conducts said second branch current upon reception thereof, an output circuit branch, coupled to said second voltage divider circuit, that conducts a portion of said voltage divider current in response to conduction of said second branch current by said input circuit branch, thereby causing said second bias voltage to have a first value when said first amplifier circuit branch conducts said first branch current, and said second bias voltage to have a second value when said second amplifier circuit branch conducts said second branch current, and a plurality of additional output circuit branches that are adapted to be selectively connected to said output circuit branch, thereby allowing said output circuit branch and said plurality of additional output circuit branches of said current mirror circuit to selectively conduct one of a corresponding plurality of portions of said voltage divider current in response to reception of said second branch current by said input circuit branch of said current mirror circuit, thereby causing said second bias voltage to have said first value when said first amplifier circuit branch conducts said first branch current, and said second bias voltage to selectively have one of a corresponding plurality of second values when said second amplifier circuit branch conducts said second branch current.

8. An apparatus including a voltage comparator circuit with hysteresis, said voltage comparator circuit comprising:

first and second power means for conveying a power supply voltage;

input signal means for conveying an input signal;

first voltage divider means for providing a first bias voltage at said input signal terminal, wherein said input signal has opposing peak signal levels of opposite polarities relative to said bias voltage;

second voltage divider means for conducting a voltage divider current and thereby providing a second bias voltage, wherein said first and second bias voltages are unequal;

amplifier means with first and second circuit means for alternately conducting first and second branch currents, respectively, wherein said first amplifier circuit means is for conducting said first branch current when a sum of said first bias voltage and said input signal has a first polarity and magnitude relative to said second bias voltage, and said second amplifier circuit means is for conducting said second branch current when said sum of said first bias voltage and said input signal has a second polarity and magnitude relative to said second bias voltage; and current mirror means with
input circuit means for conducting said second branch current, and
output circuit means for conducting a portion of said voltage divider current in response to said conduction of said second branch current by said input circuit means, thereby causing
said second bias voltage to have a first value when said first amplifier circuit means conducts said first branch current, and
said second bias voltage to have a second value when said second amplifier circuit means conducts said second branch current.

9. An apparatus including a voltage comparator circuit with hysteresis, said voltage comparator circuit comprising:

first and second power means for conveying a power supply voltage;

input signal means for conveying an input signal;

first voltage divider means for providing a first bias voltage at said input signal terminal, wherein said input signal has opposing peak signal levels of opposite polarities relative to said bias voltage;

second voltage divider means for conducting a voltage divider current and thereby providing a second bias voltage, wherein said first and second bias voltages are unequal;

amplifier means with first and second circuit means for alternately conducting first and second branch currents, respectively, wherein said first amplifier circuit means is for conducting said first branch current when a sum of said first bias voltage and said input signal has a first polarity and magnitude relative to said second bias voltage, and said second amplifier circuit means is for conducting said second branch current when said sum of said first bias voltage and said input signal has a second polarity and magnitude relative to said second bias voltage;

current mirror means with
input circuit means for conducting said second branch current, and
output circuit means for conducting a portion of said voltage divider current in response to said conduction of said second branch current by said input circuit means, thereby causing
said second bias voltage to have a first value when said first amplifier circuit means conducts said first branch current, and
said second bias voltage to have a second value when said second amplifier circuit means conducts said second branch current;
another output circuit means; and
another current mirror means which includes
input circuit means for conducting said first branch current upon reception thereof, and
output circuit means for coupling said second amplifier circuit means to said one of said first and second power means in response to conduction of said first branch current by said input circuit means.

10. An apparatus including a voltage comparator circuit with hysteresis, said voltage comparator circuit comprising:

first and second power means for conveying a power supply voltage;

input signal means for conveying an input signal;

first voltage divider means for providing a first bias voltage at said input signal terminal, wherein said input signal has opposing peak signal levels of opposite polarities relative to said bias voltage;

second voltage divider means for conducting a voltage divider current and thereby providing a second bias voltage, wherein said first and second bias voltages are unequal;

amplifier means with first and second circuit means for alternately conducting first and second branch currents, respectively, wherein said first amplifier circuit means is for conducting said first branch current when a sum of said first bias voltage and said input signal has a first polarity and magnitude relative to said second bias voltage, and said second amplifier circuit means is for conducting said second branch current when said sum of said first bias voltage and said input signal has a second polarity and magnitude relative to said second bias voltage; and current mirror means with input circuit means for conducting said second branch current, and output circuit means for conducting a portion of said voltage divider current in response to said conduction of said second branch current by said input circuit means, thereby causing said second bias voltage to have a first value when said first amplifier circuit means conducts said first branch current, and said second bias voltage to have a second value when said second amplifier circuit means conducts said second branch current;

a plurality of additional output circuit means that are adapted to be selectively connected to said output circuit means, thereby allowing said output circuit means and said plurality of additional output circuit means of said current mirror means to selectively conduct one of a corresponding plurality of portions of said voltage divider current in response to reception of said second branch current by said input circuit means of said current mirror means, thereby causing said second bias voltage to have said first value when said first amplifier circuit means conducts said first branch current, and said second bias voltage to selectively have one of a corresponding plurality of second values when said second amplifier circuit means conducts said second branch current.

11. A method for performing a voltage comparison with hysteresis, comprising the steps of:

receiving an input signal via an input signal terminal;

generating a first bias voltage at said input signal terminal, wherein said input signal has opposing peak signal levels of opposite polarities relative to said bias voltage;

conducting a voltage divider current and thereby generating a second bias voltage, wherein said first and second bias voltages are unequal;

alternately conducting first and second circuit branch currents by conducting said first circuit branch current when a sum of said first bias voltage and said input signal has a first polarity and magnitude relative to said second bias voltage, and conducting said second circuit branch current when said sum of said first bias voltage and said input signal has a second polarity and magnitude relative to said second bias voltage; and shunting a portion of said voltage divider current by mirroring said second circuit branch current, thereby causing said second bias voltage to have a first value during conduction of said first circuit branch current, and said second bias voltage to have a second value during conduction of said second circuit branch current.

12. The method of claim 11, further comprising the steps of:

mirroring said second circuit branch current and thereby disabling mirroring of said first circuit branch current during said step of conducting said second circuit branch current; and mirroring said first circuit branch current and thereby disabling mirroring of said second circuit branch current during said step of conducting said first circuit branch current.

13. The method of claim 11, wherein said step of shunting a portion of said voltage divider current by mirroring said second circuit branch current comprises selecting from among and shunting one of a plurality of portions of said voltage divider current by mirroring said second circuit branch current, thereby causing said second bias voltage to have said first value during conduction of said first circuit branch current, and said second bias voltage to selectively have one of a corresponding plurality of second values during conduction of said second circuit branch current.

* * * * *